US007479844B2

(12) United States Patent
Kormanyos

(10) Patent No.: US 7,479,844 B2
(45) Date of Patent: Jan. 20, 2009

(54) METHOD TO IMPROVE CHARACTERISTICS OF PIN DIODE SWITCHES, ATTENUATORS, AND LIMITERS BY CONTROL OF NODAL SIGNAL VOLTAGE AMPLITUDE

(75) Inventor: Brian K. Kormanyos, Edmonds, WA (US)

(73) Assignee: The Boeing Company, Chicago, IL (US)

( * ) Notice: Subject to any disclaimer, the term of this patent is extended or adjusted under 35 U.S.C. 154(b) by 174 days.

(21) Appl. No.: 11/549,495

(22) Filed: Oct. 13, 2006

(65) Prior Publication Data

US 2008/0088388 A1 Apr. 17, 2008

(51) Int. Cl.
*H01P 1/15* (2006.01)
*H03H 11/28* (2006.01)
*H03H 11/02* (2006.01)

(52) U.S. Cl. ........................................ 333/103; 333/32

(58) Field of Classification Search ................ 333/101, 333/103, 124, 32
See application file for complete search history.

(56) References Cited

U.S. PATENT DOCUMENTS 4,442,416 A * 4/1984 Epsom et al. ............... 333/263
2007/0002781 A1* 1/2007 Yoon et al. .................. 370/280

OTHER PUBLICATIONS

Robert V. Garver, "Theory of TEM diode switching," IRE Transactions on Microwave Theory and Techniques, pp. 224-238, May, 1961.
J. K. Hunton, and A. G. Ryals, "Microwave variable attenuators and modulators using PIN diodes," IRE Transactions on Microwave Theory and Techniques, pp. 262-273, Jul. 1962.
D. Leenov, "The silicon PIN diode as a microwave radar power protector at megawatt levels," IEEE Transactions on Electron Devices, pp. 53-61, Feb. 1964.
Robert V. Garver, "Diode switching topics," Microwave Symposium Digest, GMTT International, vol. 72, Issue 1, pp. 44-46, May 1972.
D. G. Smith, D. D. Heston, and D. L. Allen, "Designing high power limiter circuits with GaAs PIN diodes," IEEE Microwave Theory and Techniques Symposium Digest, pp. 329-331, 1999.

* cited by examiner

*Primary Examiner*—Dean O Takaoka
(74) *Attorney, Agent, or Firm*—Klein, O'Neill & Singh, LLP

(57) ABSTRACT

A method to improve characteristics of PIN diode switches, attenuators, and limiters via the control of nodal signal voltages by local impedance control.

8 Claims, 5 Drawing Sheets

METHOD TO IMPROVE CHARACTERISTICS OF PIN DIODE SWITCHES, ATTENUATORS, AND LIMITERS BY CONTROL OF NODAL SIGNAL VOLTAGE AMPLITUDE

BACKGROUND

1. Field of the Invention

The present invention is related to RF and microwave circuits, and particularly circuits using PIN diodes designed by minimizing parasitic capacitance of the PIN diode. The method is not limited to circuit designs that minimize or resonate out diode capacitance. Capacitance could even be deliberately introduced and appropriate inductors employed using the method to control impedance at the diode node to advantage.)

2. Related Art

A P-type, Intrinsic, N-type diode (PIN) is a semiconductor device. PIN diodes are constructed with alternating layers of positively doped, intrinsic, and negatively doped semiconductor material. PIN diodes can be used as RF and microwave signal switches, voltage or current controlled attenuators, and limiters. In these applications, the DC bias condition of the diode controls the effective RE or microwave resistance of the diode.

Increasing voltage amplitude of an RF/microwave signal at higher power levels may cause unwanted changes in the DC condition resulting in undesirable changes in circuit operation. Changes can be caused by forward conduction of a large RF signal that exceeds an applied reverse DC bias. Re-combination of electrical charge carriers in the intrinsic region of a forward biased diode and the associated rectification effect increase for a large RF signal and can also result in changes. Changes can also be caused by reverse voltage breakdown. In addition, high RF voltages can cause significant non-linear changes in parasitic capacitance in the PIN diode under reverse biased conditions. Voltage driven capacitance changes and resistance changes due to recombination can result in unwanted generation of harmonics and inter-modulation distortion, or mixing effects.

Traditional design techniques for RF/microwave PIN diode switches, attenuators and limiters resonate out the parasitic capacitance of the PIN diode device using passive distributed transmission lines, or lumped element techniques. These techniques maintain an impedance match condition at the input and output around a frequency bandwidth.

PIN diodes fabricated with different technologies have different control requirements. For example, PIN diodes fabricated by integrated circuit processes often have lower breakdown voltages than other PIN diodes. PIN diodes fabricated in GaAs or other related materials have higher forward bias voltages than silicon diodes. Furthermore, PIN diodes, like all junction diodes, also have a parasitic capacitance, which is a non-linear function of voltage. This capacitance, which changes with the instantaneous RF or microwave voltage, results in undesirable generation of harmonic frequencies, or sum and difference inter-modulation frequencies. Changes in forward current due to re-combination of charge carriers in the intrinsic region also contribute to harmonic distortion and inter-modulation.

PIN diodes used in switches are generally turned completely OFF in reverse DC bias or completely ON with as much forward DC bias as is practical. In the case of a reverse biased switching diode, the reverse bias DC control voltage must exceed the amplitude of the RF/microwave signal voltage or the diode begins to forward conduct due to the net DC current from the inefficient, yet unavoidable, rectification due to recombination in the intrinsic region. The DC control voltage cannot be increased without limit because reverse breakdown occurs. Reverse biased diodes also exhibit the effects of capacitance modulation by the RF voltage resulting in non-linear effects including generation of harmonics and inter-modulation. Clearly a reduction in RF voltage amplitude for a given power level by a reduction in local impedance can provide significant improvements in operating power range and reduction of harmonic and inter-modulation distortion in the reverse biased diode in a series or shunt PIN diode switch. When the shunt diodes are switched to the ON state with large forward bias, the extra current associated with the lower impedance is not a problem for circuit operation and it can be accommodated by increasing the size of the diode.

PIN diode attenuator circuits employ PIN diodes that are forward biased with specific current levels to achieve a desired effective resistance to the RF/microwave signal. The diodes may be in series, shunt, or both. In general, shunt diodes prefer lower impedances and lower voltages to reduce impedance changes due to rectification and to reduce voltage variable capacitive effects. A partially forward biased series diode should exhibit less rectification and more ideal behavior with the lower forward currents present in a higher impedance environment.

Some limiter circuits consist of diodes with no DC bias applied. As the RF/microwave power in the circuit increases, the forward bias voltage of the diode is exceeded by the RF/microwave signal, and the inefficient rectification due to carrier recombination results a forward current increasing with the RF signal amplitude. The resulting attenuation increases with RF power increase and provides a power-limiting characteristic. The onset of this process occurs at a fixed voltage and RF/microwave power level, related to the forward voltage of the diode. This level may be above or below the desired power level. Control of the RF/microwave voltage, around the limiter diode, could provide some control over the power level where the limiting action occurs.

A number of prior art methods have been created to address the foregoing problems and limitations.

For example, the characteristic impedance might be reduced everywhere in a system, to increase power handling capability. However, reducing the characteristic impedance everywhere does not provide a good method for matching impedances to other components.

An alternative method is to increase voltage and power handling capability by stacking diodes in series. This method could be applied to attenuators, switches, and limiters as well. However, stacking diodes, to increase voltage capability, can be done only in discrete integer steps. The instantaneous voltage splitting across a diode stack cannot be guaranteed without the addition of more components. To create a diode stack a larger area is required and is not as space efficient as a single diode, due to the redundancy of contacts.

A forward or reverse DC bias may be applied to a limiter adjusting its power threshold, either above or below the value based on the diodes constant forward voltage. However, providing for the bias of a limiter requires additional components to isolate the RF signal from the DC connections and requires an additional power supply.

Local control of signal voltage in part of a zero bias limiter circuit may be used. However, the local voltage control or maximization by resonance depends on an earlier set of diodes in the circuit, already being in forward conduction, due to an applied signal. This application is very circuit specific and it is not described or presented as a general technique. Voltage control is only postulated at one node and the reduction of voltage is not explored. The PIN diode may be moved in the signal path or chain to a place where the signal has lower amplitude to control inter-modulation distortion in a PIN diode adjustable attenuator stage. However, moving a PIN diode attenuator in an RF signal path or chain, to reduce inter modulation distortion is often not compatible with other system requirements. Attenuation and re-amplification produces added thermal noise. Linearization techniques and other methods used to correct inter modulation distortion are complicated.

The current state of the art design methodology is unable to provide satisfactory design solution using PIN diodes. Hence, there is a need in the art for an improved design method.

SUMMARY OF THE INVENTION

The present invention provides a method for controlling the local RF impedance in the region of the diodes, using passive RF and microwave impedance transforming techniques. Accordingly, RF voltage amplitude for a given power level may be optimized, resulting in improved operation for all types of PIN diode circuits. Benefits include, a reduction of control voltage amplitude, an increase in power handling capability, reductions in harmonic or inter-modulation distortion, and control of power level threshold in unbiased limiters.

The impedance at the internal nodes can be varied in most cases, controlling voltage by adjusting the ratio of voltage to current at a given power level. Thus, the same matching techniques can be used to simultaneously control the impedance match at the input and output and the RF/microwave voltage amplitude at internal nodes at the diodes resulting in improved performance. This can be done by designed control of the local impedance at the diode with the addition of very few or perhaps no additional components.

Reducing the voltage results in an increase in current at the same power level. This increase in current could be handled by using a larger diode, or using diodes in parallel. In most integrated circuit processes, it is simple and easy to increase the size of a diode by altering its geometry. This alteration can be done through a continuous range, with good consistency, and across the entire active area of the device.

The methodology provided by the invention is compatible with ordinary circuits and design methods. The varying voltage amplitudes at different local impedance nodes are easily simulated and optimized, using standard large signal simulation techniques, such as harmonic balance or time domain methods.

This brief summary has been provided so that the nature of the invention may be understood quickly. A more complete understanding of the invention may be obtained by reference to the following detailed description of embodiments thereof in connection with the attached drawings.

BRIEF DESCRIPTION OF THE DRAWINGS

The foregoing features and other features of the present invention now are described with reference to the drawings. In the drawings, the same components have the same reference numerals. The illustrated embodiment is intended to illustrate, but not to limit the invention. The drawings include the following Figures.

DETAILED DESCRIPTION

Figure 1:
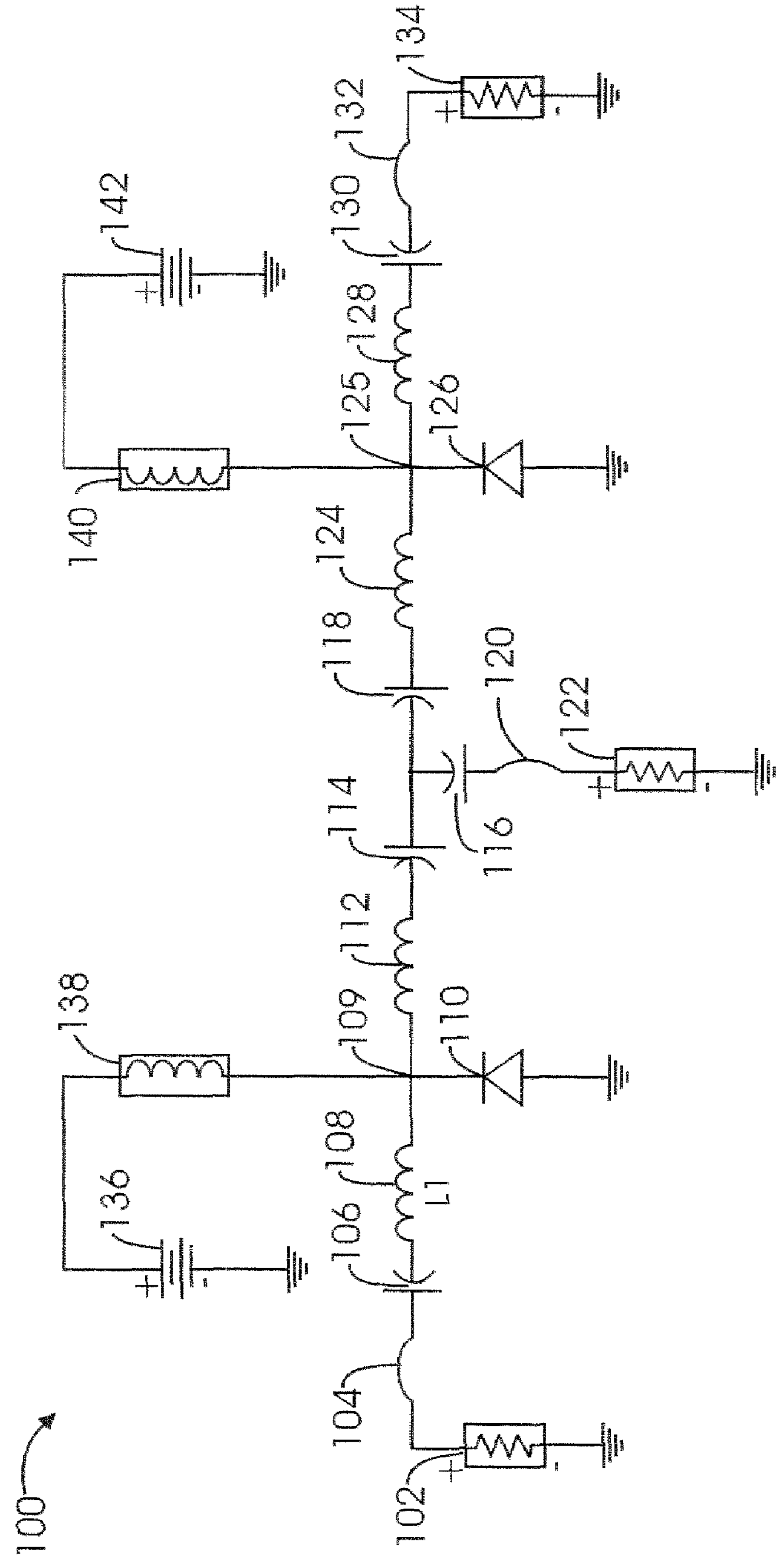
FIG. 1 shows a simplified transmit/receive (T/R) switch schematic in accordance with an embodiment of the present invention.
Figure 2:
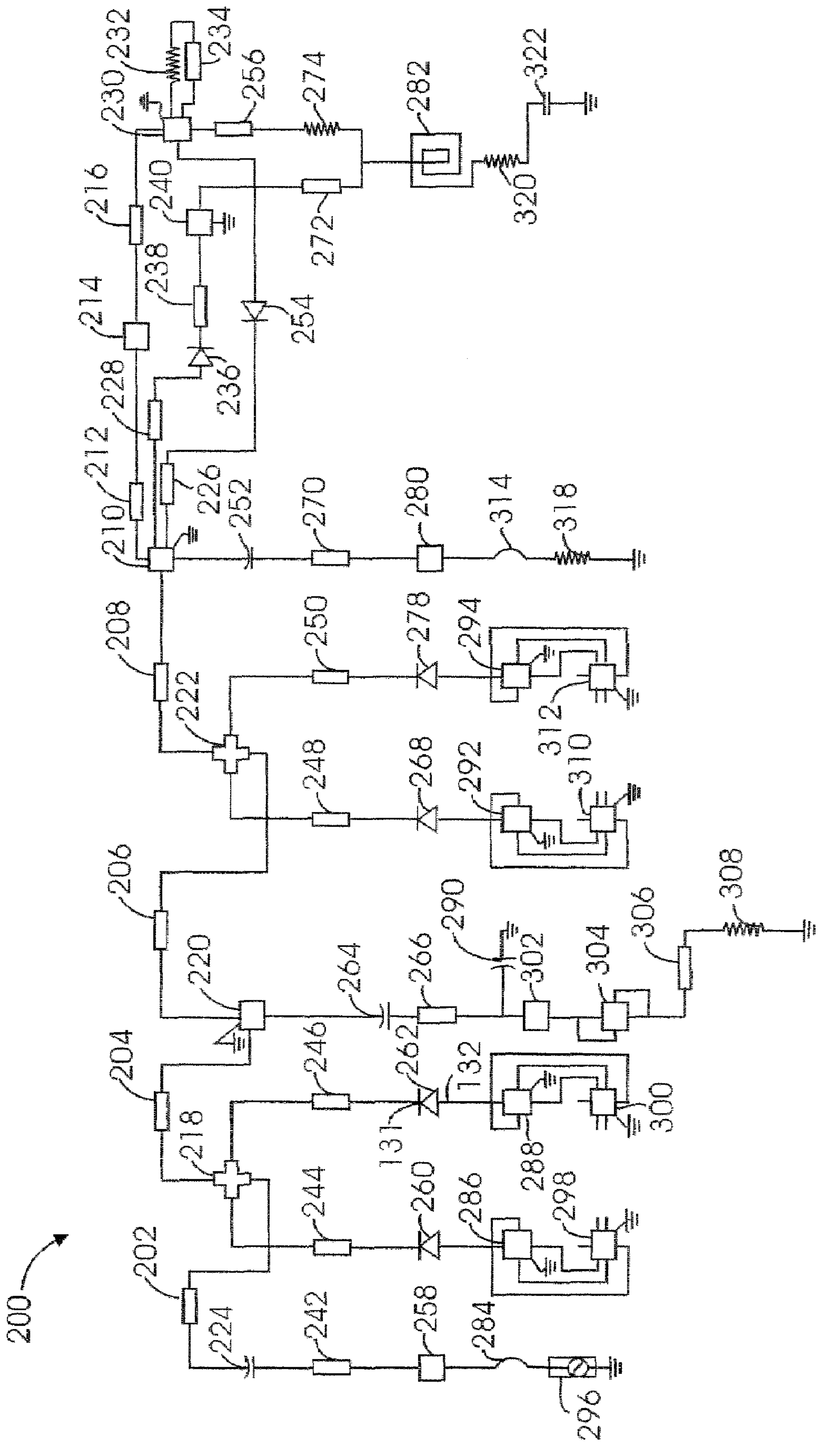
FIG. 2 shows a T/R switch simulation model that was simulated and optimized in accordance with an embodiment of the present invention.

Although the circuit configurations illustrated in FIG. 1 and FIG. 2 and their associated descriptions employ a Transmit/Receive (T/R) switch, any Radio Frequency (RF) circuit, and microwave circuit that employs PIN diodes as an active element, including attenuators and phase shifters, may be designed with the present invention.

The present invention provides an iterative technique in which a set of goals are defined and the circuit is modified until the deviation from the goals is minimized. Iterative techniques are used because a mathematical solution in closed form is not available. When continuously variable internal input and output impedances are present between stages, a closed form solution might not exist.

To better understand and appreciate the invention the operation of a simplified version of a shunt PIN diode antenna T/R switch is discussed below.

There is a class of switches used in transceiver applications whose function is to connect an antenna to a transmitter (exciter) in the transmit state and to the receiver during the receive state. PIN diodes are often used as active elements in these switches.

FIG. 1 shows an implementation of a T/R switch 100. In one embodiment T/R switch 100 may be constructed by connecting parallel (shunt) diodes 110 and 126 at each side of an antenna 122. In this embodiment, antenna 122 is coupled to receiver port 134, or transmitter port 102, by adjusting the voltage sources 136 and 142 (both voltage sources can have a positive or negative value).

When diode 126 in the path to receiver port 134 is turned on, diode 126 shorts out the signals in this path and presents an inductor 124, shorted to ground through diode 126 in antenna 122. The values of inductor 108 and capacitor 106 can be adjusted to match out inductor 124 and result in matched signal flow to transmitter port 102.

Alternatively, if diode 110 in the path to transmitter port 102 is turned on, diode 110 shorts the inductor 112 to ground. Inductor 128 and capacitor 130 values then allow matched power to flow from antenna 122 to receiver port 134.

In addition to providing impedance match, proper selection and adjustment of the inductor and capacitor values can be used to lower impedance at node 109 and node 125. Lower impedance at these nodes lowers the RF/microwave voltage amplitude, resulting in improved performance.

Choke 138 and choke 149 are connected between voltage sources 136 and 142 respectively, to provide DC returns to the bias currents and open circuit for the RF signal.

Capacitor 114, connected between inductor 112 and capacitor 116, and capacitor 118, connected between inductor 124 and capacitor 116, function as DC blocking capacitors that contribute little to the matching tasks, although they can be used for matching if needed.

Capacitors 106 and 130, in addition to being used for matching functions, also function as DC blocking capacitors. Wires 104 and 132 on the input and output ports are bond wires, that have an important effect on matching, but wires 104 and 132 are parasitic components in general and exist by necessity only.

Figure 3:
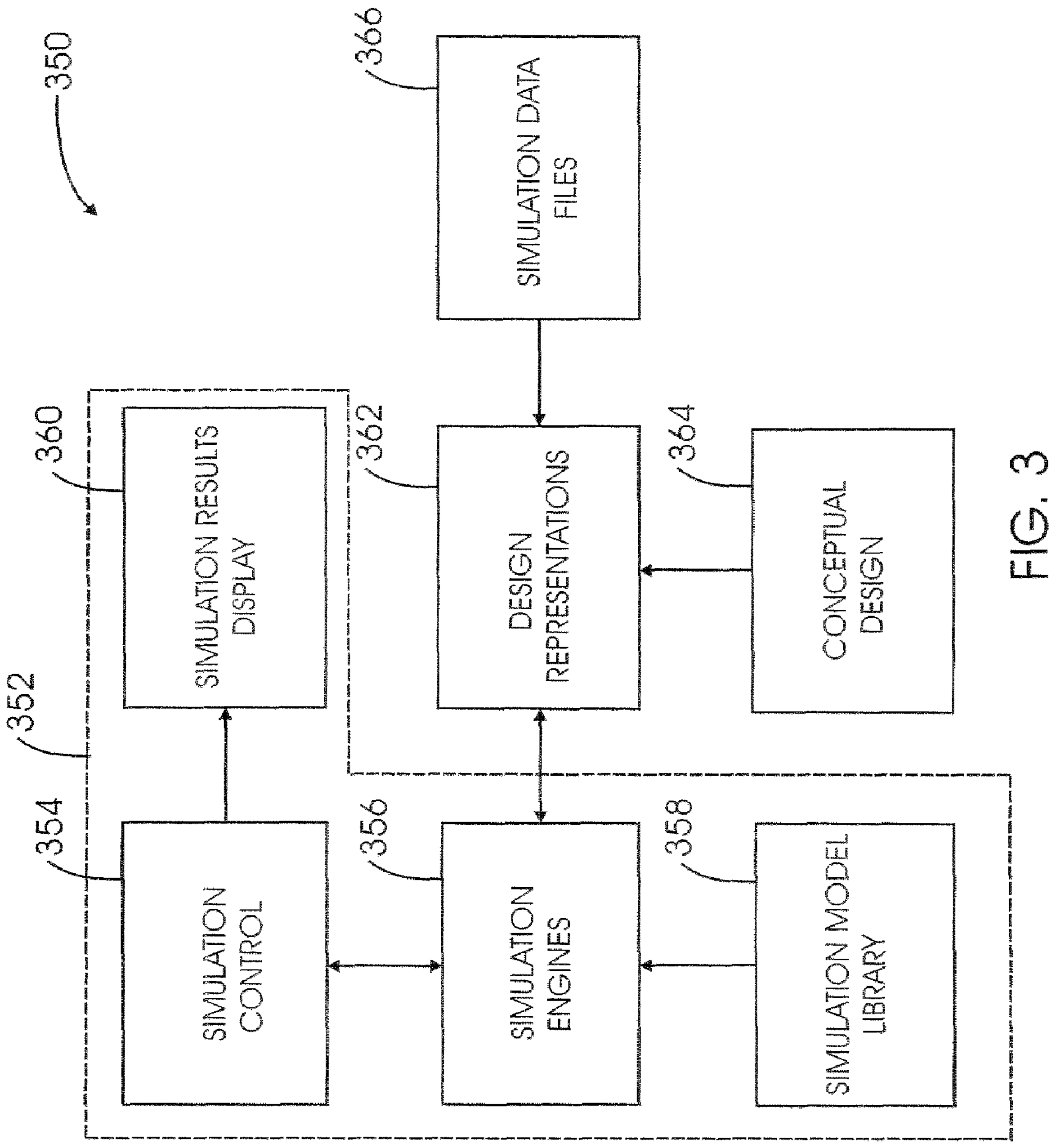
FIG. 3 a block diagram showing a design environment that was used optimizing PIN diode performance.

FIG. 2 shows an application of a circuit simulation model 200 as applied to the transmit arm of a shunt PIN diode antenna T/R switch. In one embodiment, circuit 100 may be simulated and optimized employing a design environment, such as simulation environment 350 illustrated in FIG. 3.

In this embodiment, simulation environment 350 includes Advanced Design System (ADS) 352 available from Agilent Technology, Inc. ADS is a multiengine simulation system that includes a harmonic balance simulator 356 that calculates and optimizes voltages at the internal circuit nodes. The ADS 352 also includes a simulation control means 354, a simulation result presentation means 360, and a simulation model library 358.

In one embodiment, the methodology of the present invention incorporates a number of simulators and simulation steps to arrive at a desired solution. The stated goal is the optimization of a PIN diodes performance in the circuit. It is accomplished by controlling the local RF impedance in the region of the diodes by impedance matching, over a range of frequencies, modifying source and load impedances, which are different at each frequency.

Referring again to FIG. 2, circuit simulation model 200 includes the following elements:

lumped elements, capacitors 224, 252, 264 and 322 and resistors 234, 274, 308 318, 320 and 232;

PIN diode models 236, 254, 260, 262, 268 and 278 including resistors and capacitors, where the resistors are set to either a high or a low value corresponding to the ON and OFF states;

PAD sub circuit blocks 258, 302, 304 and 280;

microstrip transmission line models, MLIN 202, 204, 206, 208, 212, 216, 226, 228, 238, 234, 240, 244, 246 248, 250, 266, 270 and 272;

wire models, 284 and 314;

a rectangular microstrip inductor model, MRIND 282 discontinuity models, MCROSS 220 and 222;

data blocks 210, 214, 220, 286, 290, 292, 294 298, 300, 310 and 312; and a port 296.

Transmission line model MLIN, MRIND MCROSS WIRE used in the simulation are part of the simulator model library 358 and the represent the element's physical structures by effective lumped element inductors and capacitors whose value is automatically adjusted.

The data blocks 366 represent other discontinuities that are characterized by calculating microwave scattering, or S parameters using a Lull-wave numerical electromagnetic field solver.

To exemplify the operation of the invention, with no intent to limit the invention, a simulation and optimization are performed using simulation model 200 as applied to the circuit 100.

In this example, the first run of the simulation using small signal S parameter provides transfer function to each external port terminated in the normalizing impedance required for S parameters.

Having the required transfer function allows the complete characterization of the circuit by a harmonic balance simulator.

Harmonic balance simulation facilitates the time domain characterization of the circuit and provides information on voltage amplitude at both internal nodes and external ports directly.

Figure 4A:
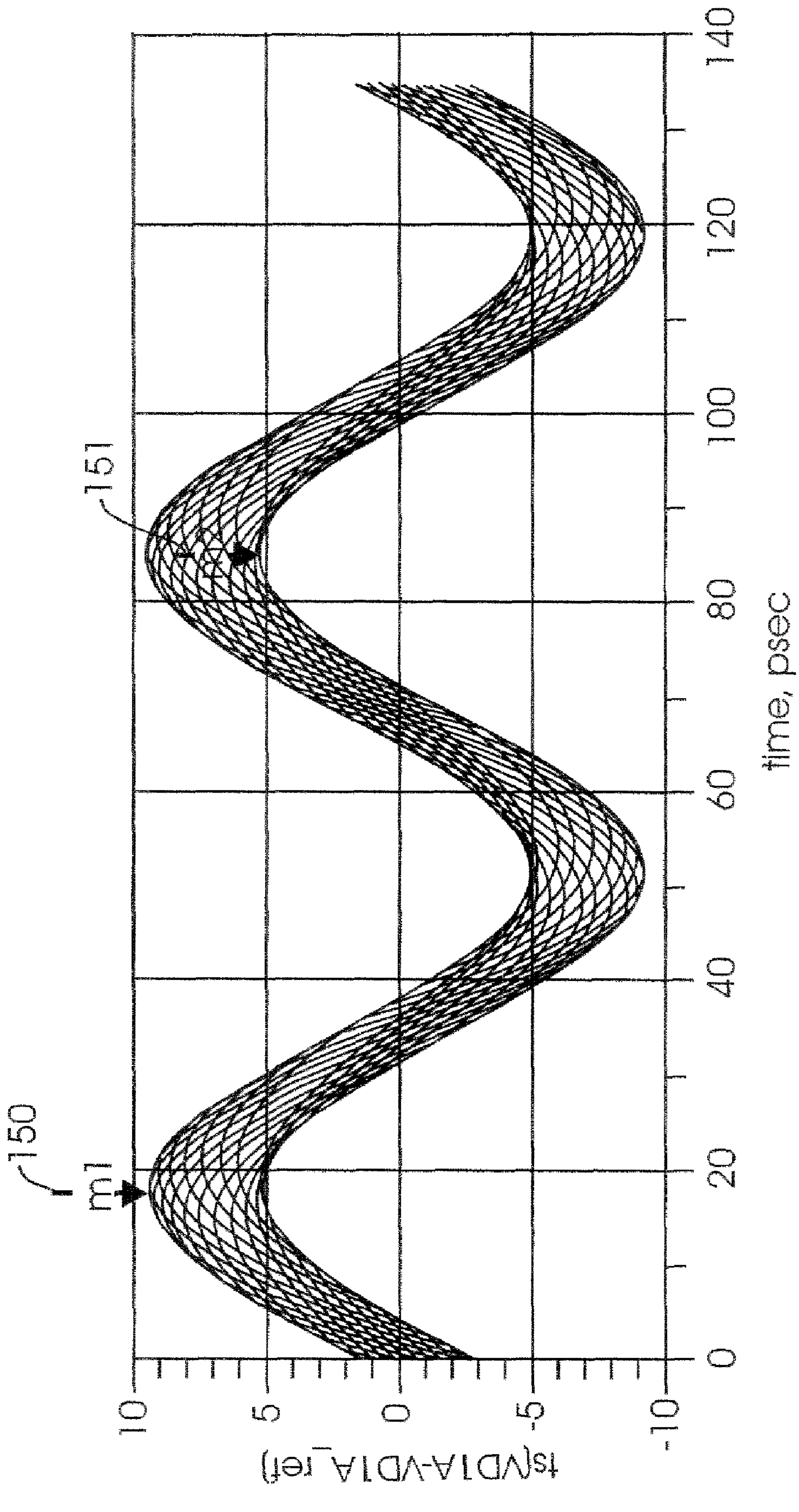
FIGS. 4A and 4B are graphs representing time series waveforms showing the simulated RF/Microwave signal voltage levels in the transmit arm of the T/R switch over a 2:1 antenna VSWR, before and after internal node voltage level optimization, respectively.
Figure 4B:
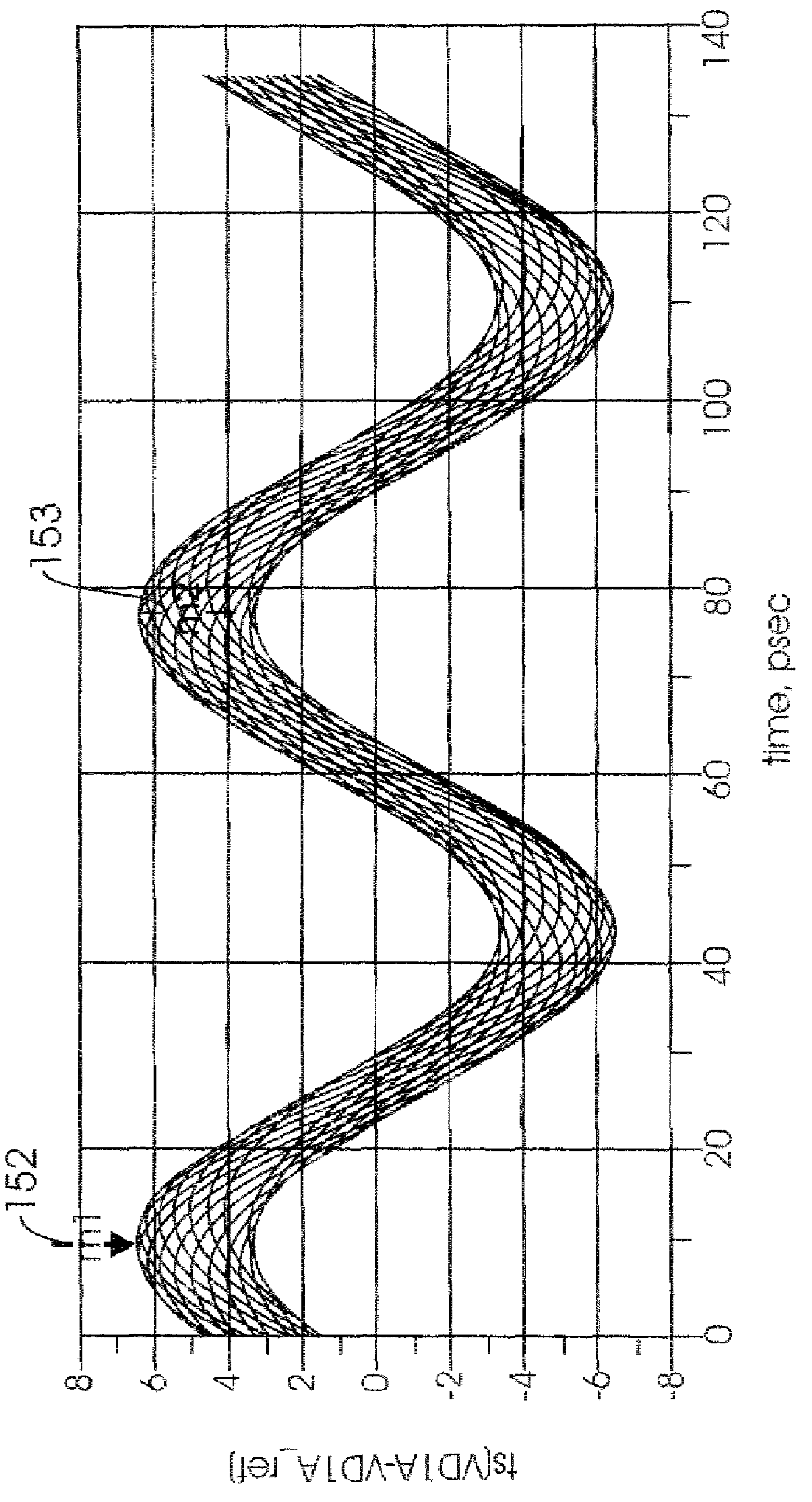

Time series waveform in FIG. 4A shows simulated RF/Microwave signal voltage levels across PIN diode 130 before internal node voltage level optimization, where marker 1 (m1) 150 is ts(VD1A–VDA_ref)=9.29 Volt, at time 17.45 psec, and m2 151 is ts(VD1A–VDA_ref)=5.09 Volt, at time 84.56 psec Time series waveform in FIG. 4B shows simulated RF/Microwave signal voltage levels across PIN diode 130 after internal node voltage level optimization. Were marker 1 (m1) 152 is ts(VD1A–VDA_ref)=6.427 Volt, at time 9.396 psec, and m2 153 is ts(VD1A–VDA_ref)=3.322 Volt, at time 76.51 psec The RF/microwave signal voltage on the diodes, for a given 0.5-Watt transmitter power level, was reduced from the peak value of 9V over a 2:1 Voltage Standing Wave Ratio (VSWR) condition to less than 6.5V, allowing an existing 7V power supply to be used for the control bias voltage Table 1 shows the relative values of the variables both prior to and after the optimization.

TABLE 1

| VARIABLES | BEFORE OPTIMIZATION | AFTER OPTIMIZATION |
|---|---|---|
| 202 | 1888.99 | 1190.27 |
| 204 | 1357.95 | 1448.33 |
| 206 | 1462.87 | 1320.11 |
| 208 | 1231.39 | 1313.03 |
| 216 | 940.82 | 582.135 |
| 218/222 (W1) | 66.838 | 25.0634 |
| 218/222 (W2) | 41.1583 | 109.008 |
| 218/222 (W4) | 77.6749 | 46.0664 |
| 218/222 (W6) | 62.5206 | 49.9892 |
| 216 (W7) | 15.00 | 15.00 |
| 252 | 1.06906 | 0.543978 |
| 224 | 0.186991 | 0.138498 |
| 264 | 0.487586 | 0.302991 |

No changes to the circuit were necessary in this case, only a coordinated optimization of component values throughout the circuit. No compromise in the desired small signal performance is experienced.

Although the present invention has been described with reference to specific embodiments, these embodiments are illustrative only and are not limiting. Many other applications and embodiments of the present invention will be apparent in light of this disclosure and the following claims.

What is claimed is:

1. A method to minimize parasitic capacitance of a PIN diode comprising: providing an input and output external nodes; selecting a local circuit impedance node that selectively couples a load to the input or output external nodes; wherein selecting the local circuit impedance node includes selecting a node where a PIN diode is present; varying an impedance at the local circuit impedance node and optimizing applied voltage at the local impedance node; wherein the optimized applied voltage is less than a control bias voltage of the PIN diode; and adjusting individual local circuit components coupled between the local circuit impedance node and the input and output external nodes to match the varied impedance at the local circuit impedance node to the impedance condition at the input and output external nodes.

2. The method of claim 1, wherein optimizing applied voltage comprises selecting the lowest voltage levels necessary to allow the local circuit to operate.

3. The method of claim 1, wherein the load is an antenna.

4. The method of claim 1, wherein the adjusted individual local circuit components are passive components.

5. A method to minimize parasitic capacitance of a PIN diode, the method comprising: providing a circuit with an individual node, an input node and an output node, the individual node selectively coupling a load to the input node or the output node and receive an applied voltage from the coupled input node or the output node; varying impedance at the individual node of the circuit and optimizing applied voltage at the individual node; and maintaining overall impedance control of the circuit during the varying of the impedance at the individual node; wherein the individual node includes a PIN diode; and wherein the optimized applied voltage is less than a control bias voltage of the PIN diode.

6. The method of claim 5, wherein maintaining overall impedance control of the circuit comprises adjusting individual local circuit components coupled to the individual node, input node and output node to match the varied impedance at the individual node to the impedance condition at input and output nodes.

7. The method of claim 5, wherein the load is an antenna.

8. The method of claim 6, wherein the adjusted individual local circuit components are passive components.

* * * * *